(12) United States Patent
Comparat et al.

(10) Patent No.: US 12,387,901 B2
(45) Date of Patent: Aug. 12, 2025

(54) SURFACE ANALYSIS SYSTEM COMPRISING A PULSED ELECTRON SOURCE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE PARIS-SACLAY, Gif-sur-Yvette (FR)

(72) Inventors: Daniel Comparat, Paris (FR); Nicholas Barrett, Gif sur Yvette (FR); Lionel Amiaud, Palaiseau (FR); Yan Picard, Breuillet (FR); Anne Lafosse, Paris (FR); Raphaël Hahn, Orsay (FR); Olena Fedchenko, Mainz (FR); Gerd Schoenhense, Mainz (DE)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE PARIS-SACLAY, Gif-sur-Yvette (FR)

( * ) Notice: Subject to any disclaimer, the term of this patent is extended or adjusted under 35 U.S.C. 154(b) by 473 days.

(21) Appl. No.: 17/921,587

(22) PCT Filed: Apr. 28, 2021

(86) PCT No.: PCT/EP2021/061068
§ 371 (c)(1),
(2) Date: Oct. 26, 2022

(87) PCT Pub. No.: WO2021/224079
PCT Pub. Date: Nov. 11, 2021

(65) Prior Publication Data
US 2023/0170176 A1 Jun. 1, 2023

(30) Foreign Application Priority Data

May 5, 2020 (FR) .................................. 2004444

(51) Int. Cl.
H01J 37/06 (2006.01)
H01J 37/22 (2006.01)
(Continued)

(52) U.S. Cl.
CPC ............. *H01J 37/06* (2013.01); *H01J 37/22* (2013.01); *H01J 37/244* (2013.01); *H01J 37/26* (2013.01);
(Continued)

(58) Field of Classification Search
CPC .......... H01J 37/06; H01J 37/22; H01J 37/244; H01J 37/26; H01J 2237/05;
(Continued)

(56) References Cited

U.S. PATENT DOCUMENTS 4,414,509 A 11/1983 Singh et al.
5,043,630 A * 8/1991 Faillon ................ H01J 25/04
315/5

(Continued)

OTHER PUBLICATIONS

Moufarej, et al. "Forced field ionization of Rydberg states for the production of monochromatic beams", Phys. Rev. A, vol. 95, No. 4, 043409, 2017.
(Continued)

Primary Examiner — David A Vanore
(74) Attorney, Agent, or Firm — BakerHostetler

(57) ABSTRACT

A system for performing surface analysis on a material, includes a pulsed electron source that forms a monochromatic beam of incident electrons; means for conveying the incident electrons to the surface of a sample of material, so as to form backscattered electrons, and the backscattered electrons to detecting means, the conveying means compris-
(Continued)

ing at least one electron optical system; means for detecting the backscattered electrons; the pulsed electron source comprising: a source of atoms; a continuous-wave laser beam configured to form a laser excitation zone able to excite the atoms to Rydberg states; a pulsed electric field on either side of the laser excitation zone, the pulsed electric field being configured to ionize at least the excited atoms and to form a monochromatic beam of electrons.

15 Claims, 3 Drawing Sheets

(51) Int. Cl.
*H01J 37/244* (2006.01)
*H01J 37/26* (2006.01)

(52) U.S. Cl.
CPC ..... *H01J 2237/05* (2013.01); *H01J 2237/083* (2013.01); *H01J 2237/24475* (2013.01)

(58) Field of Classification Search
CPC ....... H01J 2237/083; H01J 2237/24475; H01J 2237/06333; H01J 2237/06341; H01J 2237/2626; H01J 37/29; H01J 37/073
See application file for complete search history.

(56) References Cited

U.S. PATENT DOCUMENTS

| | | | | |
|---|---|---|---|---|
| 5,099,117 A | * | 3/1992 | Frohn | B82Y 35/00 850/13 |
| 5,973,323 A | * | 10/1999 | Adler | H01J 37/285 250/307 |
| 6,310,341 B1 | * | 10/2001 | Todokoro | H01J 37/28 250/305 |
| 6,586,733 B1 | * | 7/2003 | Veneklasen | H01J 37/26 250/307 |
| 6,803,571 B1 | * | 10/2004 | Mankos | H01J 37/26 850/10 |
| 6,878,937 B1 | * | 4/2005 | Mankos | G01N 23/203 250/306 |
| 6,946,657 B2 | * | 9/2005 | Kienzle | H01J 37/28 250/305 |
| 7,425,701 B2 | * | 9/2008 | Steigerwald | H01J 37/244 250/306 |
| 11,101,102 B2 | * | 8/2021 | Majumdar | H01J 37/263 |
| 2002/0070340 A1 | * | 6/2002 | Veneklasen | H01J 37/26 250/307 |
| 2007/0200062 A1 | * | 8/2007 | Tromp | H01J 37/05 250/306 |
| 2008/0099674 A1 | * | 5/2008 | Bihr | G03F 1/72 250/311 |
| 2008/0173829 A1 | | 7/2008 | Zolotorev | |
| 2009/0242792 A1 | * | 10/2009 | Hosoya | H01J 37/222 250/397 |
| 2009/0321634 A1 | * | 12/2009 | Khursheed | H01J 49/142 250/311 |
| 2019/0362935 A1 | * | 11/2019 | Huang | H01J 37/29 |
| 2020/0303177 A1 | * | 9/2020 | Schoenhense | H01J 37/10 |
| 2021/0066030 A1 | * | 3/2021 | Majumdar | H01J 37/26 |
| 2023/0170176 A1 | * | 6/2023 | Comparat | H01J 37/29 250/310 |

OTHER PUBLICATIONS

Mankos et al., "Design for a high resolution electron energy loss microscope", Ultramicroscopy, vol. 207, 2019.
Littman, et al., "Field-Ionization Processes in Excited Atoms", Phys. Rev. Lett., vol. 41, No. 2, 1978.
Barrett, "High Resolution Electron Energy Loss Microscope", Valorisation LabEx PALM & NanoSaclay, 2020.
Bauer, "LEEM and UHV-PEEM: A retrospective", Ultramicroscopy, vol. 119, pp. 18-23, Aug. 2012.
Bauer, "Low energy electron microscopy", Reports on Progress in Physics, vol. 57, No. 9, pp. 895-938, 1994.
Darvish, et al., "Overview of current applications of the Timepix detector in spectroscopy, radiation and medical physics", Applied Spectroscopy Reviews, vol. 55, Issue 3, 2019.
Gastel, et al., "Medipix 2 detector applied to low energy electron microscopy", Ultramicroscopy, vol. 110, Issue 1, pp. 33-35, Dec. 2009.
Hollenstein, et al., "Selective field ionization of high Rydberg states: Application to zero-kinetic-energy photoelectron spectroscopy", J. Chem. Phys., vol. 115, No. 12, pp. 5461-5469, 2001.
Lehwald, et al., "Surface Phonon Dispersion of Ni(100) Measured by Inelastic Electron Scattering", Phys. Rev. Lett. 50, pp. 518-521, Feb. 1983.
Sikharulidze, et al., "Low energy electron microscopy imaging using Medipix2 detector", Nuclear Instruments and Methods in Physics Research, vol. 633, pp. S239-S242, 2011.
Tautz, et al., "Ultimate resolution electron energy loss spectroscopy at H/Si(100) surfaces", Journal of Applied Physics, vol. 84, Issue 12, 1998.
Water, et al., "Ionization of highly excited helium atoms in an electric field", Phys. Rev. A, vol. 30, No. 5, 1984.
Llopart, et al., "Timepix4, a large area pixel detector readout chip which can be tiled on 4 sides providing sub-200 os timestamp binning", Journal of Instrumentation, vol. 17, Jan. 2022.

* cited by examiner

SURFACE ANALYSIS SYSTEM COMPRISING A PULSED ELECTRON SOURCE

CROSS-REFERENCE TO RELATED APPLICATIONS

This application is a National Stage of International patent application PCT/EP2021/061068, filed on Apr. 28, 2021, which claims priority to foreign French patent application No. FR 2004444, filed on May 5, 2020, the disclosures of which are incorporated by reference in their entirety.

FIELD OF THE INVENTION

The present invention relates to the field of performing surface analysis using electrons.

The invention relates to a pulsed electron source for a system for performing surface analysis.

BACKGROUND

More precisely, the invention relates to a system for performing surface analysis comprising a pulsed electron source able to form an electron beam of high spectral resolution, i.e. the energy dispersion of which is lower than or equal to 10 meV, and preferably lower than or equal to 5 meV.

The invention further allows a collimated beam (divergence lower than one milliradian) of low-energy electrons (electron energy lower than or equal to 20 eV) and therefore a beam with a very low beam emittance (dispersion in position and in phase space of the electrons) to be formed.

The system for performing surface analysis may for example be a high-resolution electron energy-loss microscope (HREELM), in particular allowing microscopy of surface vibrational states.

Surface vibrational states are of general importance in both surface physics and chemistry, and in particular allow the functionality of a material and its surface reactivity to be determined. The analysis of surface vibrational states must be carried out at low energy (energy lower than or equal to 20 eV) and with a high spectral resolution in order to allow chemical functions, phonons and plasmons to be characterized. Thus it is possible to predict and/or determine relationships between the electronic properties of a material and its mode of interaction with the environment.

Furthermore, it is necessary to be able to analyze surface vibrational states with a nanoscale spatial resolution (typically from a few nanometers to a few tens of nanometers) in a wide range of applications that seek to measure and/or modify the spatial and spectral distribution of vibrational states. Mention may be made, by way of non-limiting examples of the importance of these analyses, of systems or devices such as: semiconductor devices, in which these analyses may in particular be used to optimize charge-carrier mobility as a function of local stresses in semiconductor devices; and photovoltaic systems, in which the interaction of charge carriers with phonons may be disadvantageous because it may lead to non-radiative losses to the detriment of the purely radiative aspects sought.

Another application relates to modification of local properties, and in particular to the functionalization of molecular layers by optical or electron irradiation. The analysis of chemical transformations and of surface functionality requires a very high spectral resolution of the surface vibrational states and a spatial resolution of a few nanometers. Use of low-energy electron beams for chemical lithography is in addition one way of advancing toward a better control of the induced transformations.

Known solutions for performing analysis have either a high spatial resolution, or a high spectral resolution, or allow the bulk and not the surface of a material to be probed. Among known solutions, mention may be made of the following three solutions.

STEM-EELS (acronym of Scanning Transmission Electron Microscope—Electron Energy Loss Spectroscopy) allows a nanoscale spatial resolution and a high spectral resolution to be obtained. Imaging is performed by scanning a beam of electrons (at very high energy, i.e. between 30 keV and 300 keV or even up to 1 MeV) over a cross section of the sample, the electrons passing through the surface of the sample to reach its bulk. Thus, STEM-EELS provides information on bulk and not surface properties. Furthermore, correction of chromatic aberrations and the very low count rate achieved require excellent alignment, excellent mechanical and electrical stability, and result in a very high construction cost (several million euros or even tens of millions of euros). Lastly, sample preparation is complex and STEM-EELS is a destructive method since it requires a section of the sample to be cut by FIB (acronym of Focused Ion Beam). In conclusion, STEM-EELS cannot be used to investigate surface properties, is destructive and has major disincentives—it is not suitable for performing high-spectral-resolution and high-spatial-resolution analysis of surface vibrational states.

LEEM (acronym of Low-Energy Electron Microscopy) is a technique for performing surface analysis that is typically used to obtain an image of the surface of a material, of atom(s)-surface interactions and/or of thin films. One example of a low-energy electron microscope has been illustrated in FIG. 1. In LEEM, electrons of high energy (of the order of 15-20 keV) are emitted by an electron gun 1, then focused using a set of electron optical systems 2 (set of electrostatic or magnetic lenses) and passed through a magnetic electron-beam splitter 3. The electrons, which are said to be "fast", are deflected by the splitter in the direction of a sample 9 of material, pass through an objective lens 4 and decelerate to low energies (of the order of 1-20 eV) near the surface of the sample 9 because the sample is kept at a potential $V_9$ close to the potential $V_1$ of the electron gun 1. These low-energy electrons may be used to investigate surface properties. The sampling depth from the surface of said sample may be modified by adjusting the energy of the incident electrons. Said depth is defined by the difference between the work function (i.e. the minimum energy, measured in eV, required to pull an electron from the Fermi level of an atom to a point located at infinity outside the atom) of the sample and of the electron gun plus a value called the start voltage, which is of the order of a few eV, which approximately defines the kinetic energy of the electrons with respect to the surface potential of the sample and which may be adjusted to give the electrons the desired kinetic energy. Elastically backscattered low-energy electrons return through the objective lens 4, accelerate again to the electron-gun voltage and again pass through the electron-beam splitter 3, so as to be guided through a projection optical system 5 (set of electrostatic or magnetic lenses) that generate a viewable image on an electron detector 6. This in particular makes it possible to observe, in real time, dynamic surface processes of the material, such as: phase transitions, adsorption, reactions, segregation, growth of thin layers, etching, stress release, sublimation, the magnetic microstructure, etc.

LEEM thus allows the local work function and surface crystallinity and chemistry to be characterized with a spatial resolution of the order of 15 nm. However, spatial mapping of surface vibrational states via electron energy losses is impossible with LEEM because the energy dispersion of the electron source is typically 250 meV, which is far too high for resolution of energy-loss spectra to be possible.

HREELS (acronym of High-Resolution Electron Energy-Loss Spectroscopy) is a technique for performing analysis that consists in analyzing the energy and direction of electrons scattered by a surface when the latter is irradiated by a monochromatic beam of electrons the energy of a few eV of which is defined to within a few meV. One example of HREELS has been illustrated in FIG. 2. The sample 9 of material to be analyzed is exposed to a monochromatic electron beam generated by means of an electron gun 1 and of a first monochromator 7a. The electrons are scattered by the surface of the sample 9 that is exposed to the beam. The scattering is mainly due to the interaction of the Coulomb potential of the electrons with the dipole field of the surface of the sample. Measurement of energy losses and their wave-vector dispersion parallel to the surface makes it possible to probe most low-energy excitations, for example:
surface phonons;
the vibrational modes of isolated atoms or molecules;
surface and interface plasmons;
low-energy electron excitations, in particular due to states in the band gap.

Energy loss is measured by an electron detector 8 that is placed at the exit of a second monochromator 7b and that allows high-spectral-resolution spectroscopy of the energy losses of electrons to be carried out, with an energy dispersion lower than or equal to 10 meV, or even lower than or equal to 1 meV under the best conditions.

However, the use of monochromators implies a deceleration of the electron beam and a concomitant increase in angular divergence, this decreasing transmission function and substantially increasing aberrations. Thus, the electron beam is divergent and incident on 1 mm² of the sample. The size of the monochromatic beam implies a loss of intensity of three orders of magnitude, preventing microscopy, and the aberrations resulting from the angular divergence prevent imaging. Thus high-resolution energy-loss spectroscopy does not allow spatial imaging with nanoscale resolution to be achieved.

Thus, the prior-art techniques do not allow spatial imaging with nanoscale resolution and a high spectral resolution to be combined.

The document: US 2008/173829 discloses an electron source that is in particular intended to be used in low-energy electron microscopy, and that uses a pulsed laser to generate coherent wave packets in Rydberg atoms, these wave packets then being ionized via a field effect by means of a pulsed electric field that is synchronized with the laser. This source generates on average one electron per laser pulse, and therefore a very low current—lower than one pico-ampere (pA).

The document U.S. Pat. No. 4,414,509 discloses a low-energy magnetometer comprising an electron source based on field-effect ionization of Rydberg atoms generated by pulsed lasers.

The article by E. Moufarej et al. "*Forced field ionization of Rydberg states for the production of monochromatic beams*", Phys. Rev. A, 95, 043409 (2017) studies field-effect ionization of Rydberg atoms in a continuous electric field. The article also mentions the possibility of using a pulsed electric field, but only for the purpose of improving the precision of the measurement of the energy of long-lived Rydberg states. On this subject, it refers to M. G. Littman "*Field-Ionization Processes in Excited Atoms*", Phys. Rev. Lett. Vol. 41, n° 0.2 (1978).

The article by M. Mankos et al. "*Design for a high resolution electron energy loss microscope*", Ultramicroscopy 207 (2019) 112848 discloses a number of energy-loss-microscope configurations able to use continuous electron sources based on field-effect ionization of Rydberg atoms.

SUMMARY OF THE INVENTION

The invention aims to overcome the aforementioned drawbacks of the prior art.

More particularly, the invention aims to provide a new electron source allowing a monochromatic beam of electrons, i.e. the energy dispersion of which is lower than or equal to 10 meV, and preferably lower than or equal to 5 meV, to be produced, without using a monochromator. The invention thus aims to control the energy dispersion of the electrons in the formed electron beam.

The invention also aims to provide a system for performing surface analysis, such as a high-resolution electron energy-loss microscope ("HREELM"), incorporating such an electron source, the electrons of which are of low energy (lower than or equal to 20 eV), allowing an analysis of the surface vibrational states of a material to be carried out, and more precisely spatial imaging with nanoscale resolution and with high spectral resolution (energy dispersion lower than or equal to 10 meV, and preferably lower than or equal to 5 meV) to be carried out.

A device allowing these drawbacks to be overcome is a system for performing surface analysis on a material, comprising:
  a pulsed monochromatic electron source, allowing a monochromatic beam of incident electrons to be formed;
  means for conveying all or some of the incident electrons to the surface of a sample of material, so as to form backscattered electrons, and all or some of the backscattered electrons to detecting means, said conveying means comprising at least one electron optical system, and preferably a plurality of electron optical systems;
  means for detecting all or some of the backscattered electrons,
characterized, in that the pulsed monochromatic electron source comprises:
  a source of atoms;
  at least one continuous-wave laser beam configured to form a laser excitation zone able to excite at least some of said atoms to Rydberg states;
  means for generating a pulsed electric field on either side of the laser excitation zone, said pulsed electric field being configured to ionize at least some of the excited atoms and to form a monochromatic beam of electrons.

Preferably, the beam of electrons is of low emittance. The term "emittance" refers to the beam of electrons and designates the dispersion in position and in phase space of the electrons.

By "monochromatic" beam of electrons (this type of beam also being called a "single-energy" beam of electrons), what is meant is a beam of electrons the energy dispersion of the electrons of which is lower than or equal to 10 meV, and preferably lower than or equal to 5 meV.

To obtain a monochromatic beam, the electrons must be produced at substantially the same voltage. Now, the source according to the invention allows almost instantaneous ionization in a zone where the voltage varies little spatially; the electrons are therefore produced in the same electric-field environment, and thus the beam of electrons formed is monochromatic.

By "Rydberg state", what is meant is an excited atomic state from which ionization may occur and which contains one or more electrons the principal quantum number n of which is very high, typically higher than or equal to 20, and preferably higher than or equal to 50.

By pulsed electric field, what is meant is an electric field the amplitude of which changes rapidly and transiently (duration of the pulse) from a base value to a higher or lower value, before rapidly returning to the base value, and so on. The delay between two pulses is called the repetition rate. The pulse may be rectangular in shape, in this case the height of the rectangle is the amplitude, the width is the duration of the pulse and the distance between two rectangles corresponds to the repetition rate. The pulse may have other shapes, such as a Gaussian shape or another shape known to those skilled in the art.

According to the invention, the monochromatic electron source is a pulsed source, and it is formed by rapidly varying (variations typically shorter than or equal to one nanosecond) an electric field (pulsed electric field) about the field strength required to ionize the atoms, the atoms having been previously excited by laser beam to Rydberg states. The laser excitation is configured to excite the atoms to Rydberg states with a quantum number n high enough that the electric-field strength that needs to be applied is low and that the rapid variations thereof are achievable.

To achieve an energy dispersion of 10 meV or less for the beam of electrons, it is necessary to provide on average between $10^8$ and $10^9$ electrons per second, this corresponding to an average current between 10 and 100 picoamperes (pA). Thereabove, i.e. if the number of electrons per second is increased (for example to 1 nanoampere (nA), which corresponds to $10^{10}$ electrons per second, or more), a space-charge effect decreases spectral resolution and it becomes difficult or even impossible to obtain a monochromatic beam of electrons. Furthermore, therebelow the number of electrons becomes insufficient to achieve imaging in a reasonable time.

On these scales of $10^8$ to $10^9$ electrons per second, it is preferable to carry out the analysis of the electrons using a time-of-flight detecting device, as the known detection limit of most hybrid-pixel detectors of this type is 1 nanosecond (ns), and it may even reach 100-200 picoseconds (ps) with certain hybrid-pixel detectors or multi-anode microchannel array detectors, or even less with other DLDs (acronym of Delay Line Detectors).

It will be recalled that time-of-flight (ToF) detecting devices measure the energy of an electron via its time of flight between the departure of the electron (from the electron source) and its arrival (at the detector). Just like the detectors described above and those mentioned in the detailed description, such detecting devices comprise a flight tube, to which a potential difference may be applied, and via which the electrons reach the detector that "counts" the electrons and measures their arrival times.

With a continuous electron source, even if the beam of electrons from the source is monochromatic, it does not remain so after the electrons have struck a sample and been backscattered. In order to analyze the energy distribution of the backscattered electrons, it is necessary to scan the energies of the electrons sequentially in a continuous flow. It is thus necessary to select an electron energy range (spectral band), for example by placing a monochromator on the path of the backscattered electrons. This selection of a narrow electron spectral band results in loss of most of the electrons generated by the source, which loss may be as high as a factor of 100. Thus, with an electron source of 100 pA, only $10^7$ electrons (backscattered and selected by the monochromator) per second are obtained.

However, with a view to enabling nanoscale spatial imaging, the inventors have identified that more than $10^9$ electrons are needed to form an image. Specifically, for an image of 500×500 pixels, the inventors have estimated that, per pixel, at least 100 electrons are required to lose energy (inelastic scattering) during the interaction with the surface to achieve a sufficiently resolved loss spectrum. Allowing for the factor of 1 to 10 between inelastically scattered electrons and elastically scattered electrons and for a ratio of 1 to 10 between reflected or backscattered electrons and incident electrons, the source is required to generate about $2.5 \times 10^9$ (500×500×10×10×100) electrons.

Thus, with a continuous electron source, it would be necessary to wait at least 250 seconds to achieve imaging with high spatial resolution, this being unrealistic, not to mention that during this image-acquisition time noise may distort the result seen in the image.

Conversely, if it is desired to increase the number of electrons to take into account this loss of a factor of 100 and to decrease imaging time, the average current of the electron source must be increased. However, above 100 pA, a space-charge effect decreases spectral resolution.

Thus, the invention makes it possible to dispense with a monochromator or monochromators, and thus to limit electron losses, and makes it possible to achieve imaging with high spectral and spatial resolutions in a reasonable time (which may be a few seconds, to a few tens of seconds in the case of a 10 pA source, i.e. $10^8$ electrons per second).

The system according to the invention makes it possible to achieve imaging with high spectral and spatial resolutions.

In addition, the invention makes it possible to perform with a single system for performing surface analysis both microscopy and spectroscopy analyses, this making it possible to avoid transferring the material to be analyzed between various systems and thus compromising the reproducibility of the measurements and adversely affecting measurement and analysis time. Thus, providing a single system able to perform both microscopy and spectroscopy analyses advantageously improves the reliability of the analysis, while decreasing measurement and analysis time.

BRIEF DESCRIPTION OF THE DRAWINGS

Other features and advantages of the invention will become apparent from the following non-limiting description, which is given by way of illustration, with reference to the appended figures, in which.

DETAILED DESCRIPTION

Figure 1:
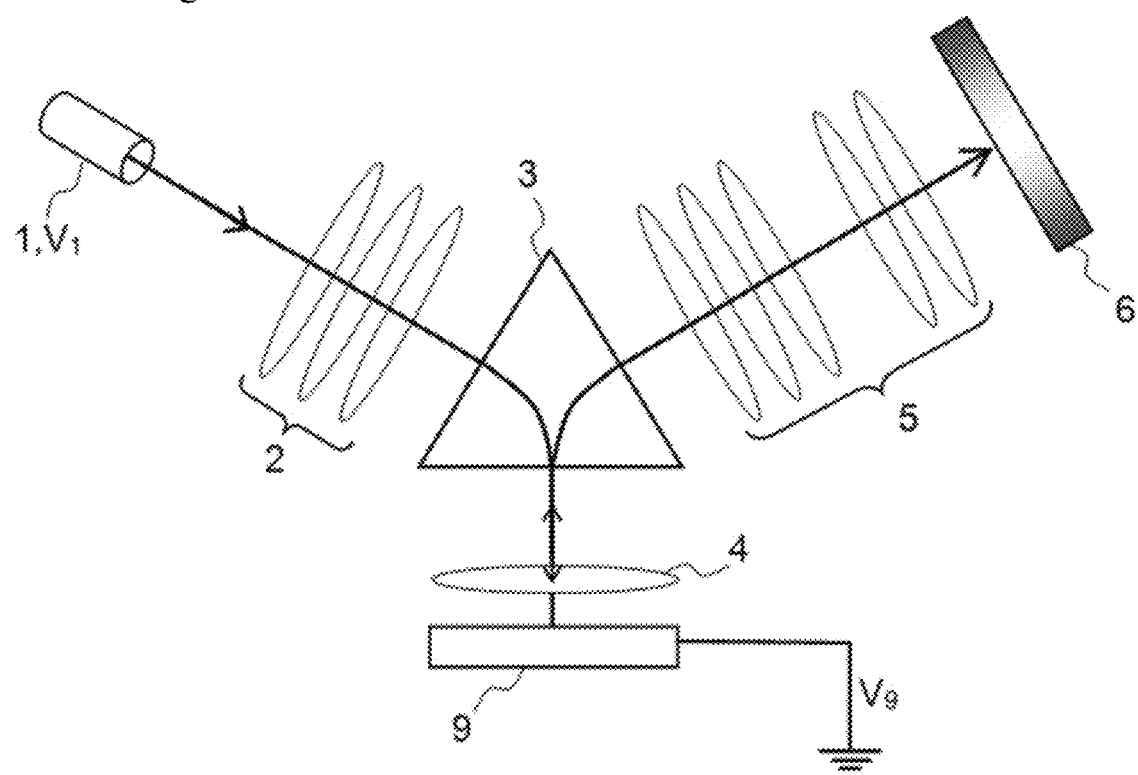
FIG. 1 shows a prior-art low-energy electron microscope.
Figure 2:
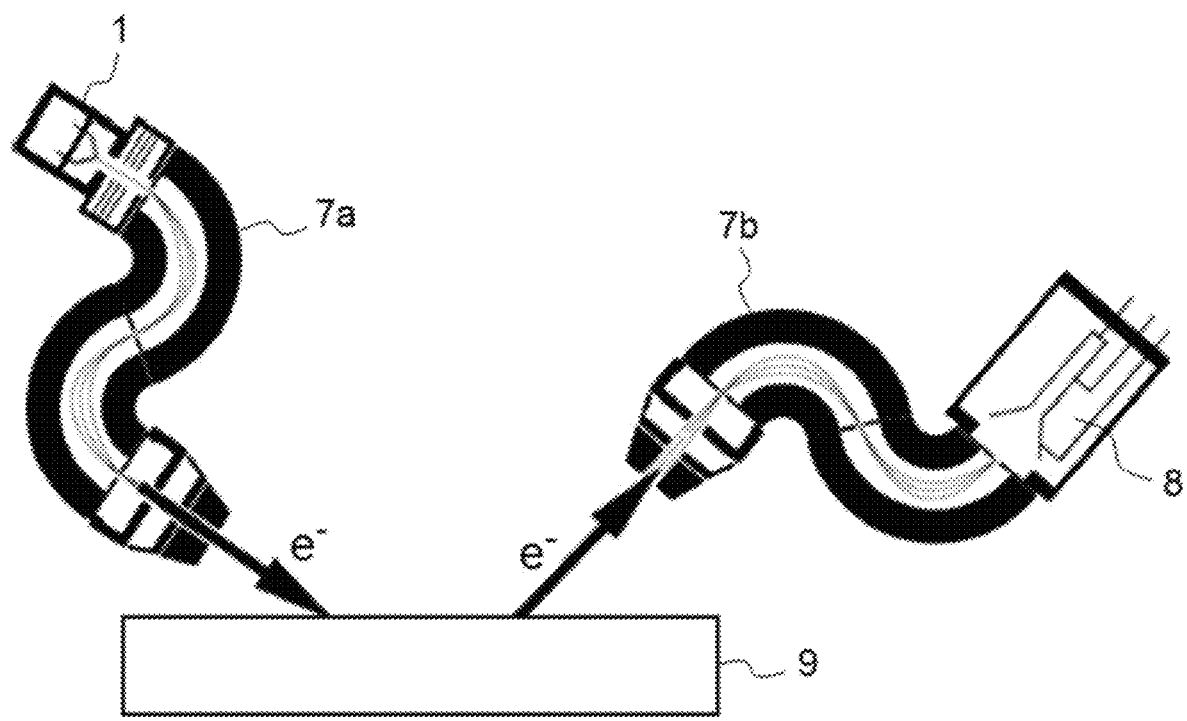
FIG. 2 shows a prior-art high-resolution energy-loss spectroscope.

FIGS. 1 and 2 were described in the section regarding the "prior art" and will not be described again here.

Figure 3:
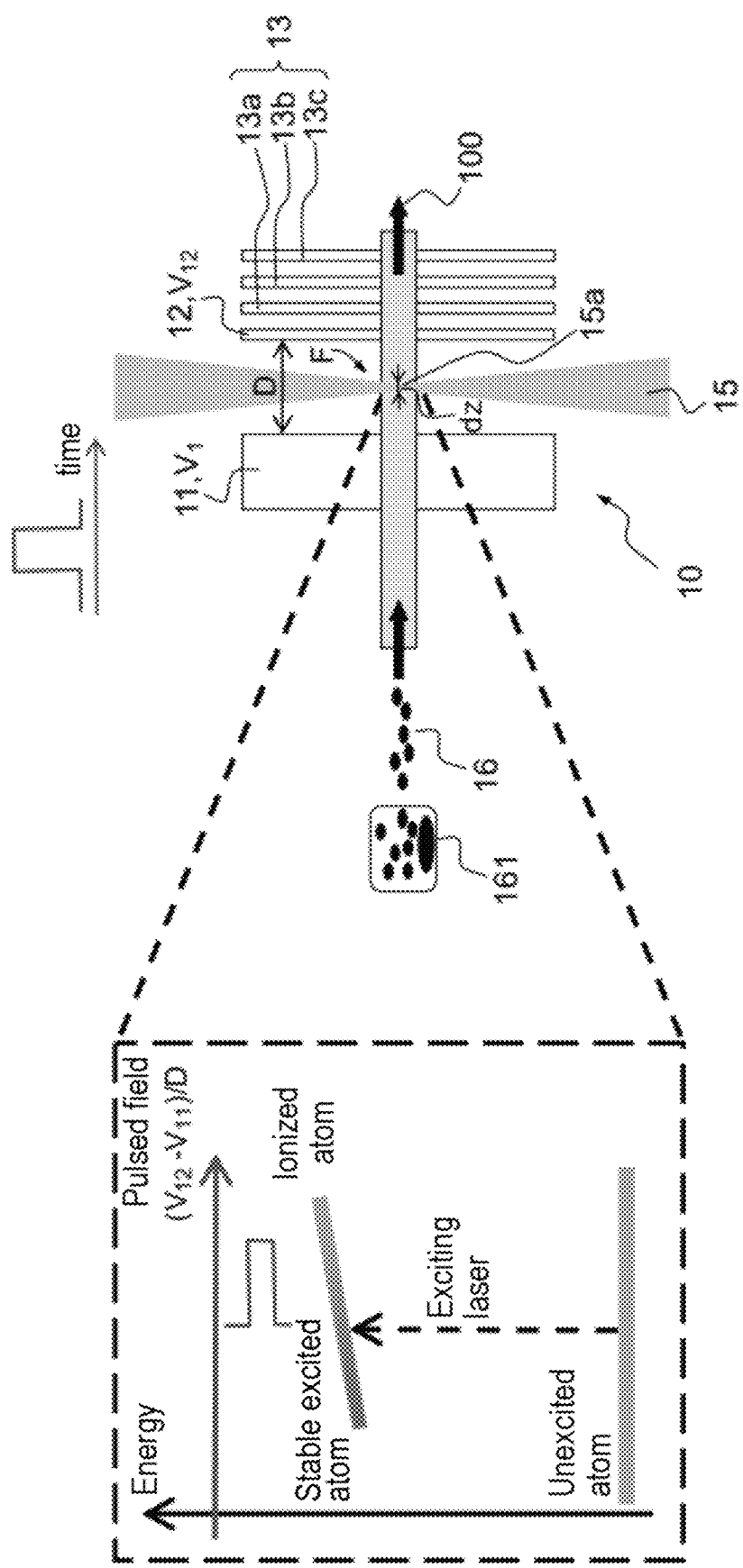
FIG. 3 shows a pulsed monochromatic electron source according to the invention.

FIG. 3 shows a pulsed monochromatic electron source according to the invention.

The pulsed monochromatic electron source (energy dispersion lower than or equal to 10 meV, and preferably lower than or equal to 5 meV) is based on laser excitation of a beam of atoms to Rydberg states and on ionization of at least some of the excited atoms by a pulsed electric field, so as to form a monochromatic beam of electrons.

The illustrated pulsed electron source 10 comprises a first electrode 11 to which a voltage $V_{11}$ is applied, and a second electrode 12 to which a voltage $V_{12}$ is applied. An electric field F designated the "ionization electric field" is formed between the first electrode and the second electrode. The voltage applied to either or both of the first and second electrodes is pulsed so that the ionization electric field is pulsed.

The distance between the two electrodes being D, the ionization electric field is given by the formula:

$$F=(V_{12}-V_{11})/D \quad (1)$$

A pulsed voltage may be applied to the first electrode 11, which by convention then forms the "ionization electrode", and a non-pulsed voltage may be applied to the second electrode 12, which by convention then forms the "extraction electrode".

Alternatively, a pulsed voltage may be applied to the second electrode 12, which then forms the ionization electrode, and a non-pulsed voltage may be applied to the first electrode 11, which then forms the extraction electrode.

Again alternatively, a pulsed voltage may be applied to the first and second electrodes.

The ionization electric field F is applied on either side of an excitation zone 15a formed by at least one laser beam 15. A beam of atoms 16 is directed toward said excitation zone, so that at least some of the atoms are excited to Rydberg states, without being ionized. The chosen Rydberg states are close to the ionization limit. It is application of the pulsed ionization electric field F on either side of the excitation zone that makes it possible to ionize the atoms and to form a monochromatic and pulsed beam of electrons 100.

The amplitude of the ionization electric field is preferably comprised between 5 and 50 V/cm. Such amplitudes make it possible to form and extract the electrons, without inducing chromatic aberration.

Preferably, the duration of a pulse is comprised between 100 ps and 1 ns.

Preferably, the pulse repetition rate is comprised between 1 MHz (1 μs) and 10 MHz (0.1 μs). For example, the ratio of 1000 between a rate of 1 ps and an electron pulse of 1 ns allows a spectral resolution of 1 meV over an energy range of 1 eV.

The illustrated pulsed electron source also comprises a gun lens 13 composed of a plurality of electrodes (here three electrodes 13a, 13b and 13c), for example a focusing electrode 13b, which may operate at about 1 kV less than the voltage of the beam of electrons, when said voltage is about 3 kV, and two surrounding electrodes 13a and 13c both at ground potential. In addition to allowing the beam of electrons to be focused and collimated, the gun lens also makes it possible to couple the pulsed electron source to the desired analysis system.

The laser beam is obtained from a continuous-wave laser, for example a laser diode or a continuous-wave Ti:Sa laser.

Specifically, a continuous-wave laser is generally less expensive than a pulsed laser and makes it possible to excite on average, and in a resonant way, a higher number of atoms.

The laser beam may further be formed by means of a number of laser stages.

Preferably, the laser power of the last laser stage is higher than or equal to 100 mW at wavelengths comprised between 300 nm and 2000 nm.

By way of example, the laser powers of the first beam, second beam and third beam (which in this case is the beam of the last laser stage) are of the order of 10 μW at 852 nm, 100 μW at 1470 nm and 1 W at 780-830 nm, respectively. The third laser is called the Rydberg excitation laser. It may be an amplified diode laser or a Ti laser. Its continuousness and its wavelength may be monitored using a high-precision optical lambdameter. The first and second lasers may be diode lasers.

The average diameters of the laser beams are of the order of about ten micrometers, or less, to ensure the uniformity of the laser excitation field.

The Rydberg states, defined here by their principal quantum number n, are preferably comprised between 50 and 100.

Preferably, the laser beams are configured (in particular, through choice of their emission wavelength) to excite the atoms to one and the same Rydberg state, characterized by a single quantum number n. This makes it possible to obtain a better atom excitation efficiency, the one or more wavelengths of the one or more laser beams being able to be precisely tuned to the one or more targeted atomic transitions. This also makes it possible to maximize the monochromaticity of the beam of electrons obtained by ionization of the Rydberg atoms.

The beam of atoms is for example obtained using an effusion cell 161.

A collimator or focuser (not shown) of atoms may be placed between the effusion cell 161 and the first electrode 11.

Alternatively to an effusion cell, an element such as an alkali-metal dispenser may be used.

Preferably, the flux of atoms is comprised between $10^{11}$ at/s/mm$^2$ and $10^{13}$ at/s/mm$^2$.

By way of example, a flux of atoms equal to $10^{12}$ at/s/mm$^2$ may be obtained with cesium.

Suitable atoms are for example those of: cesium, lithium, sodium, potassium, rubidium, magnesium, calcium, strontium, barium, chromium, erbium, silver, ytterbium, mercury, helium, neon, argon, krypton, xenon.

The electron source is preferably confined in a chamber (not shown) pumped to less than about $10^{-6}$ millibars. The chamber preferably comprises active or passive magnetic shielding, mu-metal shielding for example, in order to avoid or at least limit the effect that a magnetic field might otherwise have on the paths of the electrons.

The pulsed electron source according to the invention may have a number of applications other than as a monochromatic source in an HREELM. Besides application in an electron energy-loss microscope, as described in more detail below, the pulsed electron source according to the invention may be used in other systems for performing surface analysis that require a very monochromatic (energy dispersion lower than 10 meV or less) low-energy beam of electrons, or even in tools for functionalizing thin molecular layers using electrons with a precise energy to optimize the chemical reaction responsible for the functionalization. The monochromatic or single-energy source may also be used in studies of electron-atom or electron-molecule collisions or diffraction.

Example of Dimensions of the Pulsed Monochromatic Electron Source

It was indicated above that, to achieve a spectral resolution of 10 meV and a lateral spatial resolution better than 15 nm, it is necessary to provide on average between $10^8$ and $10^9$ electrons per second, this corresponding to an average current between 10 and 100 picoamperes (pA), and that, on these scales of $10^8$ to $10^9$ electrons per second, analysis of the electrons is preferably carried out by a time-of-flight (ToF) detecting system, as the known detection limit of hybrid-pixel detectors of this type is 1 nanosecond (ns), and it may even reach 100-200 picoseconds (ps) with multi-anode microchannel array detectors or more advanced hybrid-pixel detectors. Examples of such detectors are given below. Lateral resolution is to be understood to be with reference to the surface of the sample, the sample including structures to be analyzed, the smallest of which have sizes of the order of 15 nanometers or less, the size of the sample being larger (it is a few millimeters in diameter or width).

Given the detection limit of 1 ns, the inventors deduced that the ionization electric field should have a pulse duration of 1 ns. In other words, the pulse of the ionization electric field F must allow the atoms to be ionized in 1 ns, which is to say an ionization rate F, i.e. a number of electrons emitted per second, of $10^9$ s$^{-1}$ must be achieved. This modification in 1 nanosecond of the ionization conditions of the atoms requires a modification of their energy E. This modification dE of the energy of the atoms of the beam, which is due to the finite lifetime of the Rydberg states, is given by the equation:

$$dE = \hbar \cdot \Gamma \qquad (2)$$

where $\hbar$ is the reduced Planck constant and is equal to about $1.054 \times 10^{-34}$ J·s The ionization electric field F must therefore change by dF quickly (1 ns) about the value of the field which ionizes the atoms and which is for Rydberg states:

$$F = 1/(16 \times n^4) \qquad (3)$$

where n is the principal quantum number. The value of F given by the above formula is in atomic units.

The following relationship called the "first-order Stark effect" between the energy variation dE of a Rydberg state n and the variation in the ionization field dF is also used:

$$dE = 3 \times n \times k \times dF/2 \qquad (4)$$

where k is an integer comprised between $-(n-1)$ and $(n-1)$. This formula also uses atomic units ($5.14 \times 10^{11}$ V/m for the field, $2.4 \times 10^{-17}$ s for time and $4.36 \times 10^{-18}$ J for energy). In other words, the electric field must undergo a variation of at least dF for the Rydberg atom to be "destabilized".

Furthermore, the typical size of the laser excitation zone dz is of the order of 10 µm.

However, the energy dispersion of the electrons De (i.e. the desired spectral resolution of 10 meV at most) is given by the formula:

$$\Delta e = F \times dz = 10 meV \qquad (5)$$

The maximum ionization electric field F is then deduced therefrom as follows:

$$F = 10 \times 10^{-3}/10 \times 10^{-6} = 1000 V/m \qquad (6)$$

The minimum value of the principal quantum number n of the Rydberg state may be deduced from relationship (2):

$$n = \sqrt[4]{1/16 \times F} = \sqrt[4]{5,16 \times 10^{11}/16 \times 1000} = \sqrt[4]{32\,125\,000} \cong 75 \qquad (7)$$

The variation dF in the ionization electric field may be deduced form relationship (3), if it is assumed that k is at most:

$$k = n-1 \qquad (8)$$

Thus, the following is obtained:

$$dF(V/m) = 2 \times dE/(3 \times (n-1) \times n) = 2 \times \hbar \times \Gamma/(3 \times (n-1) \times n) = \qquad (9)$$
$$2 \times 1,054 \times 10^{-34} \times 5,14 \times 10^{11} \times (10^9/2,4 \times 10^{-17})/(3 \times 75 \times 74)$$

It is therefore sufficient in 1 ns to modify the field F by a value dF equal to 0.3 V/m.

Thus it suffices in 1 ns to modify the voltage $V_{11}$ by a value of 0.3 mV if D is equal to 1 mm or with a value of 1.2 mV if D is equal to 4 millimeters.

The calculation presented above is not-limiting and simplified. Those skilled in the art will be able to adapt the calculation if other effects such as level crossings appear or if basic parameters such as the desired spectral resolution, pulse duration or the size of the laser excitation zone are modified. Different equations may be used, especially to obtain more accurate results.

Figure 4:
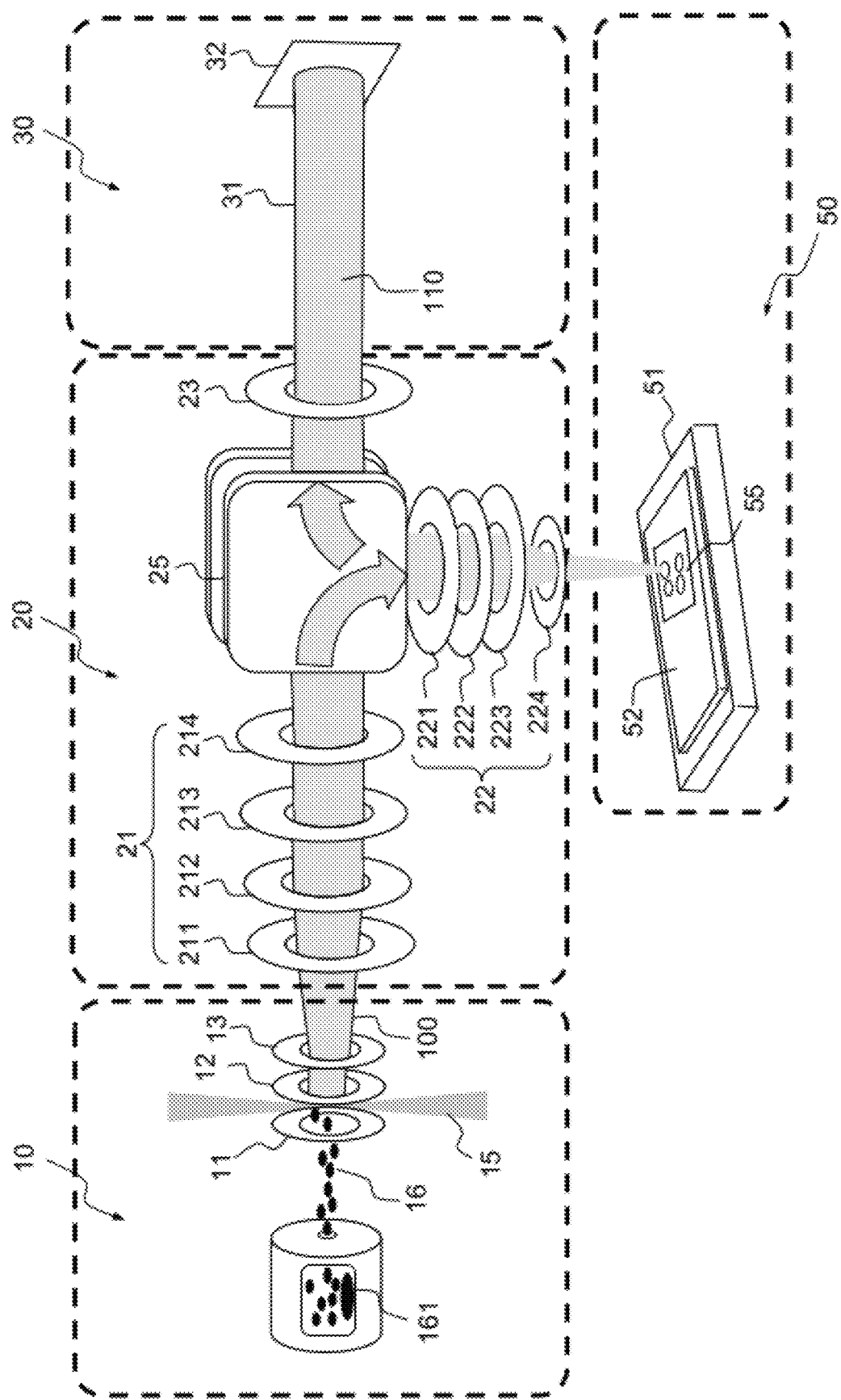
FIG. 4 shows an electron energy-loss microscope incorporating a pulsed monochromatic electron source according to the invention.

FIG. 4 shows a high-resolution electron energy-loss microscope (HREELM) according to the invention.

The energy-loss microscope illustrated comprises:
- a pulsed source 10 such as illustrated in FIG. 3 and allowing a monochromatic and pulsed beam 100 of incident electrons to be formed;
- means 20 for conveying all or some of the incident electrons to the surface of a sample of material 55, so as to form backscattered electrons 110, and all or some of the backscattered electrons to detecting means 30, said conveying means comprising a plurality of electron optical systems;
- means 30 for detecting all or some of the backscattered electrons 110.

The illustrated conveying means comprise a plurality of electron optical systems, which are typically electrostatic or magnetic lenses. In the present description, the term lens therefore designates an electrostatic or magnetic lens.

The conveying means 20 comprise an electron-beam splitter 25, said splitter being able to deflect the incident electrons by 90° toward the surface of the sample 55, to separate backscattered electrons 110 from the incident electrons 100 and to deflect said backscattered electrons toward the detecting means 30.

The splitter 25 for example comprises a magnetic prism that deflects the beam of electrons by 90°.

A set of electron optical systems, referred to as the "illumination optical system", transports the incident electrons between the source 10 and the splitter 25 and between the splitter 25 and the surface of the sample 55, and the backscattered electrons between the surface of sample 55 and splitter 25.

The illumination optical system comprises two arms: the source arm 21, which transports the incident electrons between the source 10 and the splitter 25; and the objective arm 22, which transports the incident electrons between the splitter 25 and the surface of the sample 55, and the backscattered electrons between the surface of the sample 55 and the splitter 25 (with a view to sending them to the detecting means 30).

The optical system of the illustrated source arm 21 comprises a series of four lenses, placed one after the other in the following order, in the direction of the incident electrons (i.e. from the source toward the splitter):
- a first field lens 211;
- a first condenser lens 212;
- a second field lens 213;
- a second condenser lens 214.

A field lens makes it possible to recreate the image of the electron source (also referred to as the "source" in the present description). A condenser lens makes it possible to maintain the collimation of the source.

This optical system of the source arm makes it possible to illuminate the surface (which may be designated by the term "plane" in the remainder of this description) of the sample 55 with a collimated and uniform beam of electrons, and to obtain an optical zoom of 10×, that is to say for an FoV (acronym of Field of View) of the sample that varies between 10 and 100 µm. The uniformity of the beam in the plane of the sample is obtained by mapping, at its intersection, the profile of the uniform source onto said plane. The collimation of the beam is obtained by mapping the Gaussian point of the source image onto the back focal plane (diffraction) of the objective lens, resulting in a small angle of divergence at the sample.

For a field of view of 100 µm, a single condenser lens may suffice, while two condenser lenses are needed for a field of view of 10 µm.

These conditions must be met regardless of the mode of operation, of which there are two: image mode, in which the surface of the sample is imaged on the analyzer; and diffraction mode, in which what is imaged on the analyzer is the diffraction pattern of the surface of the sample in the back focal plane of the objective lens. Whatever plane is chosen, it must first be imaged on the achromatic plane of the prism, which is located practically at the center of the prism. Otherwise, the dispersion imparted to the beam by the prism would introduce an energy-dependent shift in the detected image, pushing the beam away from the center of the analyzer.

The optical system of the illustrated objective arm 22 comprises a series of four lenses, placed one after the other in the following order, in the direction of the incident electrons (i.e. from the splitter toward the sample):
- a transfer lens 221;
- a diffraction lens 222;
- a third field lens 223;
- an objective lens 224.

The transfer lens 221 makes it possible to transfer the source (incident electrons 100) from the splitter 25 to the plane of the sample, and to return the beam of backscattered electrons 110 to the splitter 25.

The diffraction lens 222 also makes it possible to transfer the source (incident electrons 100) from the splitter 25 to the plane of the sample, and to return the beam of backscattered electrons 110 to the splitter 25, but may delay or accelerate the electrons.

The objective lens 224 and the surface of the sample form an immersion lens. The immersion lens is configured to slow down the electrons and illuminate the sample with a beam of low-energy electrons (0-100 eV): to do this, a very negative voltage is applied to the sample to decelerate the incident electrons then accelerate the backscattered electrons. It allows an intermediate image of the sample to be produced.

In image mode, the diffraction lens 222 is not excited. The third field lens 223 maps the diffraction pattern to the center of the transfer lens 221, which is also the slit plane of prism 25; and the transfer lens maps the center of the third field lens onto the achromatic plane of the prism.

In diffraction mode, the diffraction lens 222 is excited with the other lenses in order to switch between the image of the sample and the diffraction pattern in the principal planes of the prism 25. The third field lens 223 maps the diffraction plane to the center of the diffraction lens, which is then mapped by the transfer lens 221 onto the achromatic plane of the prism; and the diffraction lens maps the image of the sample in the third field lens onto the center of the transfer lens, which coincides with the plane of the slit of the prism.

Thus, the beam of incident electrons is collimated by the illumination optical system, and decelerated to the desired energy of arrival at the surface of the material 55, where it is scattered.

The electrons backscattered by the sample are accelerated in the opposite direction and transported to the beam splitter 25. The beam splitter deflects the incoming flux of electrons again by 90°, this time toward the detecting means 30, with a meV energy resolution, for detection.

In a prior-art LEEM, the real image of the sample is transferred to the achromatic plane of a dispersive beam splitter, while the diffraction pattern is transferred to the slit plane of the splitter, which has an energy dispersion generally of a few µm/eV, which is not suitable for the invention. The HREELM such as illustrated of the invention is capable of switching between two modes: in image mode, the real image of the sample is placed in the achromatic plane of the beam splitter, and in diffraction mode, the diffraction pattern of the sample is also placed in the achromatic plane of the beam splitter. In a LEEM, two lenses are generally sufficient for the source arm of the illumination optical system, and one lens is required in the objective arm. In the HREELM such as illustrated of the invention, the source arm of the illumination optical system comprises two additional lenses (field lenses) to meet the requirement of an energy dispersion of 10 meV at most, and the objective arm of the illumination optical system requires three additional lenses to maintain the flexibility of the illumination optical system (between the two modes).

The electron optical system is thus able to place the real image or the diffraction pattern of the source in the achromatic plane of the splitter and thus allows the microscope to operate in imaging mode or in diffraction mode, without adding aberrations such as is the case in a prior-art LEEM.

Preferably, the voltage of the pulsed source and the voltage of the electron optical system are for example between 3 kV and 10 kV with a stability of $10^{-6}$ in order not to compromise the spectral resolution of 10 meV. A voltage lower than 3 kV is generally avoided because it may generate aberrations that are too large. A voltage higher than 10 kV is possible but would require power supplies with a stability of $10^{-7}$, such power supplies being far more expensive.

The aforementioned article by M. Mankos et al. "*Design for a high resolution electron energy loss microscope*", Ultramicroscopy 207 (2019) 112848 describes in detail an electron-optical system suitable for implementation of the invention.

The backscattered electrons are sent to the detecting means 30 in order to be analyzed and to allow imaging of the surface of the sample.

At least one imaging optical system 23 transports the backscattered electrons 110 to the detecting means 30. The imaging optical system 23 comprises one or more electrostatic or magnetic lenses, so as to generate a viewable image on the detecting means 30.

The detecting means 30 are advantageously synchronized with the frequency of the pulsed electron source 10, in order to make it possible to record the entire spectrum of the energy losses of the electrons during each pulse of electrons.

In the illustrated example, the detecting means consist of an electron time-of-flight detector. Thus, the detecting means for example comprise an electron time-of-flight tube 31 via which the electrons reach a detector 32 that "counts" the electrons. The detector is for example a multi-pixel detector, which makes it possible to record an image of at least 500×500 pixels. Thus, the imaging device is integrated into the detector.

This detector device makes it possible to avoid losses inherent to a bandwidth analyzer that scans the detected kinetic energy to record a spectrum.

The spectral resolution is defined by the potential difference across the tube and by its length, making it possible to count all the electrons in a desired read-out time, optimizing detection efficiency with respect to the primary electrons generated by the source. The desired read-out time is typically between 100 ns (for example for a detector with 100 ps resolution) and 1 µs (for example for a detector with 1 ns resolution).

By way of example of detector, the Timepix4, which is a hybrid-pixel detector, may be used. The Timepix4 is in particular described in the publication "*The design of the Timepix4 chip: a 230 kpixel and 4-side buttable chip with 200 ps on pixel time bin resolution and 15-bits of TOTenergy resolution X*". It makes it possible to reach 195 picoseconds for 512×448 pixels (a pixel measuring 55×55 µm$^2$) i.e. a sensing area of 6.94 cm$^2$. Alternatively, the Timepix3, which is also described in the aforementioned publication, but which makes it possible to reach only 1.56 nanoseconds for 256×256 pixels, i.e. a sensing area of 1.98 cm$^2$, may be used.

The sampling part is designated by the reference 50.

The sample of material 55 to be analyzed is placed on a holder 52.

Preferably, the holder 52 is made of molybdenum or any other material that makes it possible to limit out-gassing of said holder under vacuum.

The energy-loss microscope may comprise a precision goniometer that has five axes (x, y, z, and 2 tilts) and that may optionally be able to rotate azimuthally (about the normal to the surface of the sample). This goniometer receives the sample-holding system 51 and allows it to be oriented.

The energy-loss microscope may comprise a means (not shown) for heating the sample, which is preferably able to heat the sample to as high as 800° C.

The energy-loss microscope may comprise a means (not shown) for cooling the sample, for example by way of a flow of cryogenic fluid, to the temperature of liquid nitrogen.

The various described embodiments may be combined with one another.

Furthermore, the present invention is not limited to the embodiments described above but extends to any embodiment falling within the scope of the claims.

The energy-loss microscope according to the invention is capable of mapping vibrational losses with an energy resolution of 10 meV, and preferably 5 meV, and with a nanoscale spatial resolution, typically of 15 to 20 nm, by probing the sample with electrons with an incident energy of 0 to 20 eV.

The invention (electron source and/or system for performing surface analysis) is in particular applicable to:

analysis of surface vibrational states that may play a decisive role in particular in the energy losses of charge carriers in high-efficiency photovoltaic systems;

measurement of the mobility of charge carriers in semiconductor devices, and in particular in transistor channels;

imaging the emergence of superconductivity on the surface of domains or of microscopic devices by virtue of abrupt changes in phonon spectrum;

imaging long-range electron-phonon interactions in two-dimensional electronic systems at the surface or at the oxide interfaces of transition metals;

optimization of thermoelectric composite materials and of confinement of heat through adjustment of the spectrum of integrable phonons on microscopic scales;

mapping of vibrational states that determine surface chemical reactivity;

functionalization of molecular layers by electronic irradiation and chemical characterization of the effects of the irradiation, etc.

The invention claimed is:

1. A system for performing surface analysis on a material, comprising:
   a pulsed monochromatic electron source, allowing a monochromatic beam of incident electrons to be formed;
   means for conveying all or some of the incident electrons to the surface of a sample of material, so as to form backscattered electrons, and all or some of the backscattered electrons to detecting means, said conveying means comprising at least one electron optical system, and preferably a plurality of electron optical systems;
   means for detecting all or some of the backscattered electrons, wherein the pulsed monochromatic electron source comprises:
   a source of atoms;
   at least one continuous-wave laser beam configured to form a laser excitation zone able to excite at least some of said atoms to Rydberg states;
   means for generating a pulsed electric field (F) on either side of the laser excitation zone, said pulsed electric field being configured to ionize at least some of the excited atoms and to form a monochromatic beam of electrons, the amplitude of said pulsed electric field being comprised between 5 and 50 V/cm.

2. The system for performing surface analysis on a material as claimed in claim 1, the duration of a pulse of the pulsed electric field being comprised between 100 picoseconds and 1 nanosecond.

3. The system for performing surface analysis on a material as claimed in claim 1, the delay between two pulses being comprised between 0.1 microseconds and 1 microsecond.

4. The system for performing surface analysis on a material as claimed in claim 1, the pulsed electron source of which comprises a vacuum chamber pumped to less than about 10$^{-6}$ millibars, said vacuum chamber being configured to receive at least the laser excitation zone, the atoms when they are in said excitation zone, the pulsed electric field and the electrons when they are formed.

5. The system for performing surface analysis on a material as claimed in claim 1, the pulsed electron source of which comprises at least one ionization electrode placed upstream or downstream of the laser excitation zone, the pulsed electric field (F) being formed by applying a pulsed voltage ($V_{11}$) to said at least one ionization electrode.

6. The system for performing surface analysis on a material as claimed in claim 1, the pulsed electron source of which comprises at least one extraction electrode placed upstream or downstream of the laser excitation zone and configured to generate an electric field for extracting the monochromatic electrons formed.

7. The system for performing surface analysis on a material as claimed in claim 1, the pulsed electron source of which comprises means for collimating and/or focusing the beam of electrons.

8. The system for performing surface analysis on a material as claimed in claim 1, the pulsed electron source of which comprises an effusion cell able to produce the source of atoms.

9. The system for performing surface analysis on a material as claimed in claim 1, the atoms of the source of atoms of the pulsed electron source being chosen from the following elements: cesium, lithium, sodium, potassium, rubidium, magnesium, calcium, strontium, barium, chromium, erbium, silver, ytterbium, mercury, helium, neon, argon, krypton, xenon.

10. The system for performing surface analysis on a material as claimed in claim 1, the one or more continuous-wave laser beams being configured to excite at least some of said atoms to one and the same Rydberg state.

11. The system for performing surface analysis as claimed in claim 1, the detecting means comprising one or more elements chosen from: a time-of-flight detector, a multi-anode microchannel array detector, an electron time-of-flight tube, a delay line, an imaging device.

12. The analysis system as claimed in claim 1, further comprising a second vacuum chamber at a pressure lower than less than about $10^{-9}$ millibars, said second vacuum chamber being configured to receive at least the pulsed source, the conveying means, and the detecting means.

13. The system for performing surface analysis as claimed in claim 1, the conveying means comprising a plurality of electron optical systems and an electron-beam splitter, the electron optical systems being configured to switch from an image mode wherein the real image of the sample is placed in the achromatic plane of the beam splitter, to a diffraction mode in which the diffraction pattern of the sample is also placed in the achromatic plane of the beam splitter.

14. The analysis system as claimed in claim 13, the conveying means comprising:
an electron-beam splitter;
a source arm placed between the source and the splitter and comprising:
a first field lens;
a first condenser lens;
a second field lens; and
a second condenser lens;
an objective arm placed between the splitter and the sample of material and comprising:
a transfer lens;
a diffraction lens;
a third field lens; and
an objective lens.

15. The system for performing surface analysis as claimed in claim 10 being an electron energy-loss microscope.

* * * * *